United States Patent
Liu et al.

(10) Patent No.: US 7,115,479 B2
(45) Date of Patent: Oct. 3, 2006

(54) SACRIFICIAL ANNEALING LAYER FOR A SEMICONDUCTOR DEVICE AND A METHOD OF FABRICATION

(75) Inventors: Mark Y. Liu, Portland, OR (US); Justin K. Brask, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/305,684

(22) Filed: Nov. 26, 2002

(65) Prior Publication Data

US 2004/0099904 A1   May 27, 2004

(51) Int. Cl.
   *H01L 21/76*    (2006.01)
   *H01L 21/3205*  (2006.01)
   *H01L 21/44*    (2006.01)
   *H01L 21/302*   (2006.01)

(52) U.S. Cl. .................. 438/437; 438/591; 438/624; 438/663

(58) Field of Classification Search ............... 438/437, 438/591, 624, 691, 694, 703, 705, 738, 745
See application file for complete search history.

(56) References Cited

U.S. PATENT DOCUMENTS

| | | | |
|---|---|---|---|
| 5,268,330 A | 12/1993 | Givens et al. | |
| 6,002,150 A | 12/1999 | Gardner et al. | |
| 6,156,654 A | 12/2000 | Ho et al. | |
| 6,194,748 B1 | 2/2001 | Yu | |
| 6,238,967 B1 | 5/2001 | Shiho et al. | |
| 6,287,927 B1 * | 9/2001 | Burke et al. | 438/308 |
| 6,291,278 B1 | 9/2001 | Xiang et al. | |
| 6,303,962 B1 | 10/2001 | Gardner et al. | |
| 6,338,993 B1 | 1/2002 | Lien | |
| 6,368,915 B1 | 4/2002 | Montree et al. | |
| 6,495,437 B1 * | 12/2002 | Yu | 438/591 |
| 6,498,112 B1 | 12/2002 | Martin et al. | |
| 6,518,618 B1 | 2/2003 | Fazio et al. | |
| 6,524,920 B1 | 2/2003 | Yu | |
| 6,528,888 B1 | 3/2003 | Cho et al. | |
| 6,531,192 B1 * | 3/2003 | Akram | 427/575 |
| 6,534,837 B1 | 3/2003 | Bai et al. | |
| 6,555,431 B1 | 4/2003 | Xing et al. | |
| 6,577,011 B1 | 6/2003 | Buchwalter et al. | |
| 6,596,639 B1 | 7/2003 | Easter et al. | |
| 6,617,209 B1 * | 9/2003 | Chau et al. | 438/240 |
| 6,624,489 B1 | 9/2003 | Chong et al. | |
| 6,638,851 B1 | 10/2003 | Cowley et al. | |
| 6,642,107 B1 | 11/2003 | Seo et al. | |
| 6,649,453 B1 | 11/2003 | Chen et al. | |
| 6,717,204 B1 | 4/2004 | Furuhata et al. | |
| 6,734,094 B1 | 5/2004 | Kloster et al. | |
| 6,856,630 B1 * | 2/2005 | Tanaka | 372/9 |
| 2003/0151098 A1 | 8/2003 | Nishida et al. | |

* cited by examiner

*Primary Examiner*—Hsien-Ming Lee
(74) *Attorney, Agent, or Firm*—Blakely, Sokoloff, Taylor & Zafman LLP

(57) ABSTRACT

Numerous embodiments of a method and apparatus for a sacrificial annealing layer are disclosed. In one embodiment, a method of forming a sacrificial annealing layer for a semiconductor device comprises forming one or more sacrificial layers on at least a portion of the top surface of a semiconductor device, annealing at least a portion of the device, and removing a substantial portion of the one or more sacrificial layers, where the removing results in no substantial physical alterations to the device.

27 Claims, 3 Drawing Sheets

SACRIFICIAL ANNEALING LAYER FOR A SEMICONDUCTOR DEVICE AND A METHOD OF FABRICATION

BACKGROUND

As part of the fabrication process for semiconductor devices such as integrated circuits (ICs), devices residing on a wafer typically undergo a heat treating or thermal annealing process following implantation or doping of the wafer. Annealing may serve several purposes, including physical repair of the silicon lattice structure following doping, and activation of the dopant. Several different annealing processes have been developed and implemented, but each technique carries with it certain disadvantages.

Rapid thermal annealing (RTA) is an annealing process that raises the temperature of the entire silicon wafer for particular period of time using, for example, heat lamps, which radiate the doped wafer surface. However, the RTA process may be time consuming as well as difficult to control, because the lamp turn-on times are variable, and radiative heating may introduce certain thermal control limitations.

Laser annealing is a more recent annealing process, which was developed to provide rapid annealing of one or more of the devices residing on a wafer, as well as greater thermal control. However, laser annealing may also create significant problems, due at least in part to the thermal properties of the laser, the rate of thermal diffusion in the device, and the temperatures generated at the surface of the device. Problems may include, for example, melting of the polysilicon traces, or degeneration of the lattice structure of the device. A need exists, therefore, for a method of laser annealing that addresses at least some of these limitations.

BRIEF DESCRIPTION OF THE DRAWINGS

The subject matter regarded as embodiments of the claimed subject matter is particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

DETAILED DESCRIPTION

Embodiments of the claimed subject matter may comprise a sacrificial annealing layer for a semiconductor device and a method of fabrication. In the formation of source/drain regions of a transistor, typically dopant is implanted into a substrate, and heat is subsequently applied in the vicinity of the implanted substrate, resulting in the annealing of at least a portion of the substrate. In the process of annealing, however, several undesirable characteristics may be produced in the transistor, as explained further herein. A method for reducing these undesirable characteristics may utilize a sacrificial layer during the annealing process that may have heat capacitance such that at least a portion of the heat generated at the surface of the semiconductor device is absorbed by the sacrificial layer, while still allowing adequate annealing of the doped region of the transistor substrate. In this context, a semiconductor device may alternatively be referred to as a transistor or an integrated circuit (IC).

Embodiments of the claimed subject matter may comprise a method and apparatus for laser annealing. The method may comprise forming one or more sacrificial layers on at least a portion of the top surface of a semiconductor device, annealing at least a portion of the device, and removing a substantial portion of the one or more sacrificial layers, where the removing results in no substantial physical alterations to the device.

It is worthy to note that any reference in the specification to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of the embodiments of the claimed subject matter. It will be understood by those skilled in the art, however, that the embodiments of the claimed subject matter may be practiced without these specific details. In other instances, well-known methods, procedures and components have not been described in detail so as not to obscure the embodiments of the claimed subject matter. It can be appreciated that the specific structural and functional details disclosed herein may be representative and do not necessarily limit the scope of the claimed subject matter.

Figure 2:
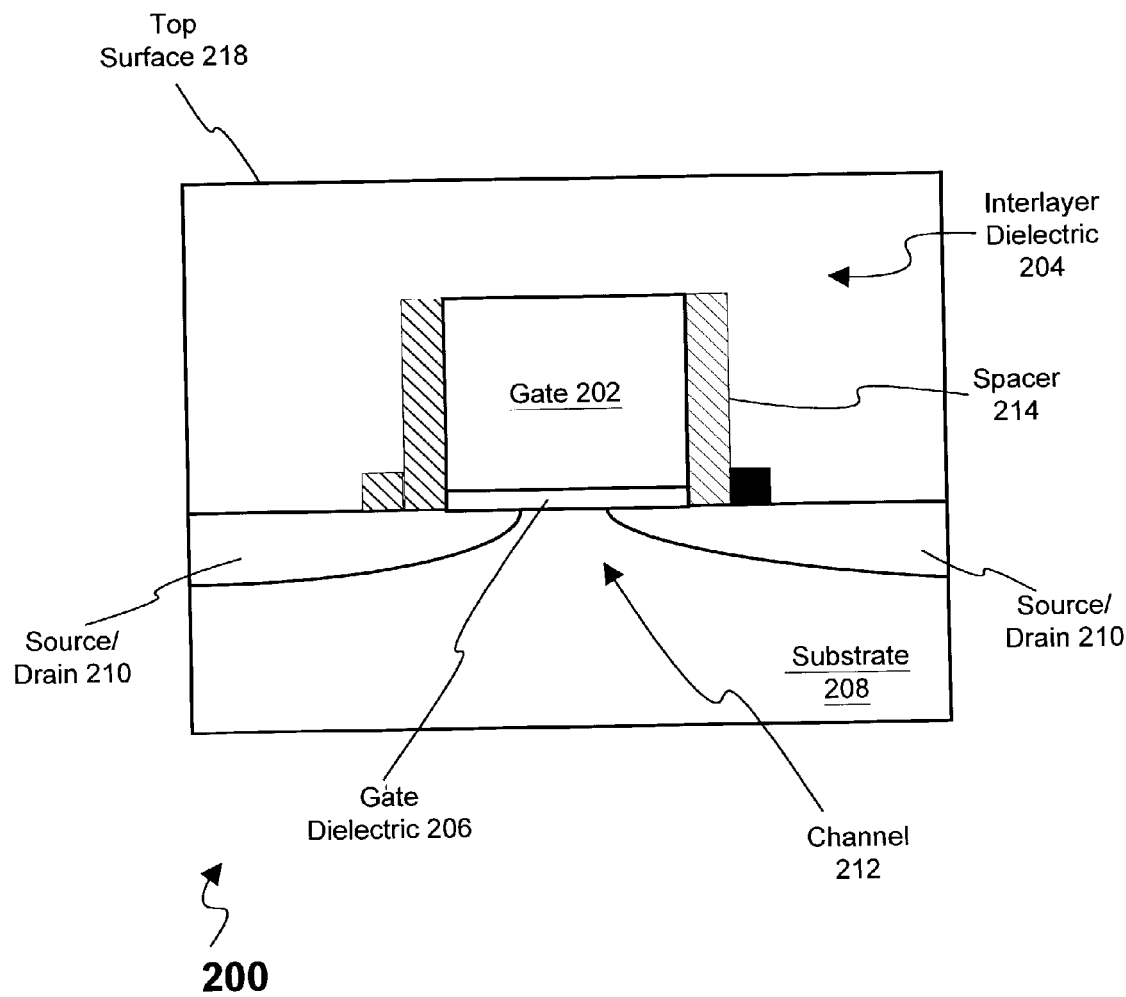
FIG. 2 is a silicon-based transistor which may be configured to incorporate one embodiment of the claimed subject matter.

Referring now in detail to the drawings wherein like parts are designated by like reference numerals throughout, there is illustrated in FIG. 2 an IC transistor 200 that may be configured to incorporate one embodiment of the claimed subject matter, and may comprise, for example, a metal oxide semiconductor (MOS) based transistor. Shown in FIG. 2 is a transistor for an integrated circuit. As is well-known, integrated circuits are usually manufactured on silicon or other semiconductor substrates. An integrated circuit may be comprised of millions of transistors such as transistor 200 of FIG. 2. Transistors such as transistor 200 typically include a substrate 208, which may comprise silicon, for example. A gate dielectric 206 is typically formed on the substrate, and may comprise silicon dioxide or other dielectric material, for example. Gate 202 is typically formed on the gate dielectric. Gate 202 is formed from an electrically conductive material, such as a metal or polysilicon based material, for example. Spacers 214 may be formed on the sides of the gate 202 and gate dielectric 206, and may be formed from a dielectric material. Spacers 214 may serve the purpose of separating the gate components from interlayer dielectric 204, and spacer geometry may vary from that illustrated by spacers 214 and still be in accordance with the claimed subject matter. An interlayer dielectric layer 204 may be formed proximate to substrate 208, and may have a top surface 218. Source/drain regions 210 may be formed in the substrate 208, and may be formed on opposite sides of gate dielectric 206, for example. Channel 212 may serve to separate the two source/drain regions 210. The source/drain regions may be at least partially formed by doping and subsequent annealing, as described in more detail hereinafter. Embodiments of IC components such as transistors may vary, and the above-described transistor is provided for illustrative purposes. Fabrication of a IC device such as transistor 200 is well known in the art, and may vary from the above-described method and still be in accordance with the claimed subject matter.

During the formation of a semiconductor device, dopant may be introduced to a substrate to facilitate the formation of source/drain regions, such as regions 210. Transistor performance may be based on the ability to control diffusion of the dopant into the substrate. Dopant may be implanted into a substrate such as substrate 208, in alignment with a gate such as gate 202. Dopant may be introduced by ion implantation, where a wafer may be bombarded with ion energy. As ions enter the wafer, one or more ions may collide with atoms forming the crystalline structure of the substrate, which may cause defects in the structure. After implantation, an annealing step may be incorporated to drive or diffuse the dopant into the substrate, resulting in formation of source/drain regions. Additionally, an annealing step may result in at least partial repair of these defects in the crystalline structure.

Annealing may be performed by a number of high-temperature processes, including RTA (Rapid Thermal Annealing) and laser annealing. As stated previously, laser annealing is one particular type of annealing process that may be incorporated when fabricating an integrated circuit. One particular type of laser annealing may be categorized as pulsed or stepped laser annealing. Pulsed or stepped laser annealing may utilize a pulsed laser beam directed at an integrated circuit, where the laser beam may pulse sequentially at one or more dice on a silicon wafer. Typically, the laser beam is turned on very briefly, e.g. for 20 nanoseconds (ns), and it is then turned off while the beam is stepped to the next die. The exposure of a laser beam may cause a phase change (i.e. solid to liquid) of a portion of the substrate, in the vicinity of dopant implantation. This may result in the dopant at least partially diffusing through the substrate. When the laser source is removed, the substrate will return to a solid phase, with at least a portion of the dopant incorporated into the lattice structure of the substrate. Shallow source/drain regions may be desirable in high-speed circuitry.

The source of a laser annealing device may be controlled in order to produce desirable characteristics in a transistor. For example, controlling the fluence and pulse width of a laser may be a way of controlling the resultant source/drain region depths, resulting in a transistor that exhibits desirable properties. However, as stated previously, this process may introduce undesirable defects.

In order to activate the dopant, the doped area of a substrate must be brought to a particular temperature. Due at least in part to factors such as thermal diffusion rates, the top surface of a transistor, such as top surface 218 of transistor 200, may be brought to an elevated temperature during a laser annealing process. This may result in a temperature delta being generated between the top surface 218 and the doped area of the source/drain region 210, and consequently, a portion of the interlayer dielectric 204 or other materials of the transistor may undergo a phase change (e.g. melting), which may compromise the structure of the transistor. Reducing the intensity of a laser during the anneal process may reduce the defects created in regions of the transistor, but will not produce the desired characteristics of the source/drain regions.

Figure 1A:
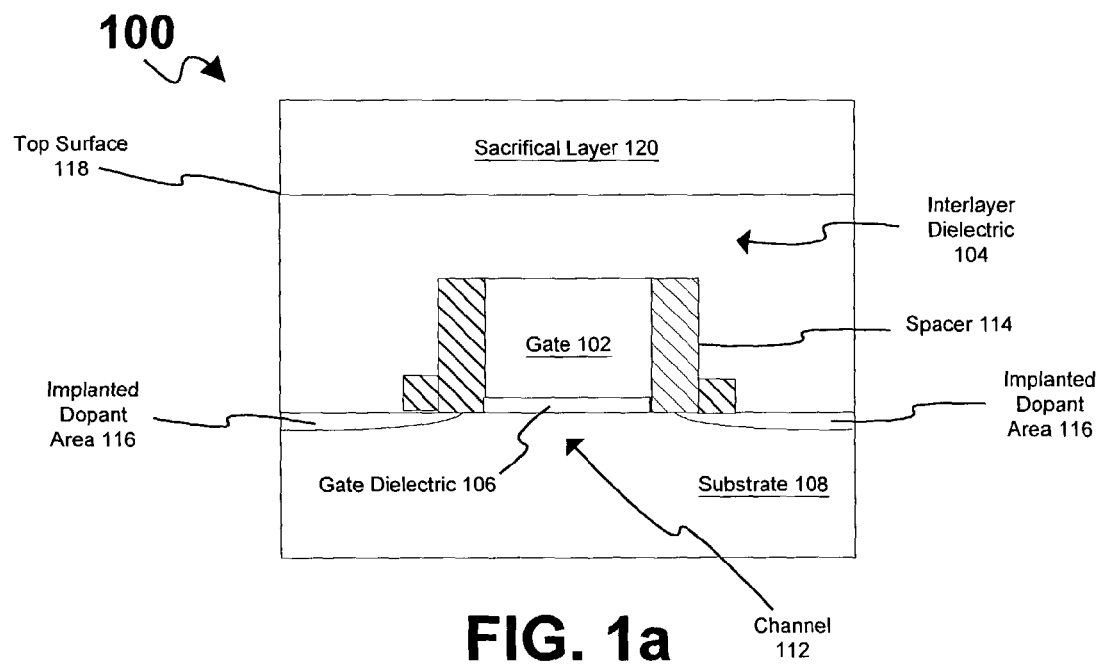
FIG. 1a is a pre-annealing transistor incorporating one embodiment of the claimed subject matter.

FIG. 1A illustrates utilization of one embodiment of a sacrificial layer in accordance with the claimed subject matter. Shown in FIG. 1A is pre-annealed transistor 100, which may be embodied on a silicon wafer (not shown). Similarly to FIG. 2, a transistor such as transistor 100 may include a substrate 108, which may comprise silicon, for example. A gate dielectric 106 is typically formed on the substrate, and may comprise silicon dioxide or other dielectric material, for example. Gate 102 is typically formed on the gate dielectric. Gate 102 is formed from an electrically conductive material, such as a metal or polysilicon based material, for example. Spacers 114 may be formed on the sides of the gate 102 and gate dielectric 106, and may be formed from a dielectric material. Spacers 114 may serve the purpose of separating the gate components from interlayer dielectric 104, and spacer geometry may vary from that illustrated by spacers 114 and still be in accordance with the claimed subject matter. An interlayer dielectric layer 104 may be formed proximate to substrate 108, and may have a top surface 118. A portion of the substrate 108 may be implanted with dopant, illustrated as implanted dopant area 116. Dopant may be introduced by any number of methods such as those previously described. Dopant may be implanted on opposite sides of gate dielectric 106, for example. Channel 112 may serve to separate the implanted dopant areas 116. Formed on the top surface of interlayer dielectric layer 104 is a sacrificial layer 120, which may be formed on at least a portion of the silicon wafer embodying IC transistor 100.

Sacrificial layer 120 may be comprised of one or more materials, such as phosphorous-doped polysilicon or a metal nitride, for example, although the claimed subject matter is not limited in this respect, but may comprise any material capable of being deposited on a surface such as interlayer dielectric 104 that exhibits desirable thermal absorption properties. In one embodiment, sacrificial layer 120 is formed on at least a portion of the silicon wafer embodying IC transistor 100, in the vicinity of the top surface 118 of interlayer dielectric layer 104. Formation may be by any number of methods, including deposition by one or more methods such as chemical vapor deposition (CVD) or by growing the sacrificial layer by one or more well-known processes. Additionally, selective deposition may be incorporated, where the entire top surface of the wafer is not coated, but selected regions may have a sacrificial layer formed thereon. Additionally, formation may result in varying thicknesses of the sacrificial layer on differing areas of the wafer. The method of forming sacrificial layer 120 may depend upon the one or more materials selected for use as a sacrificial layer, but it is important to note that the claimed subject matter is not limited in this respect, but any method that results in the formation of a sacrificial layer on at least a portion of the top surface of a silicon wafer embodying at least one IC device is in accordance with the claimed subject matter.

The thickness and/or resultant topography of the sacrificial layer 120 may depend upon factors including the type of material(s) being used as a sacrificial layer, the type of annealing being incorporated to fabricate the IC or other devices on the silicon wafer, and the thickness of a transistor, for example. It is envisioned that for an integrated circuit being fabricated to exhibit shallow source/drain regions, the thickness of the transistor being about 200 nanometers, a sacrificial layer of phosphorous-doped polysilicon may be formed on the top surface of the interlayer dielectric with a thickness of about 0.5 to 1 micron, although, of course, this is an exemplary embodiment, and the claimed subject matter is not so limited.

Figure 1B:
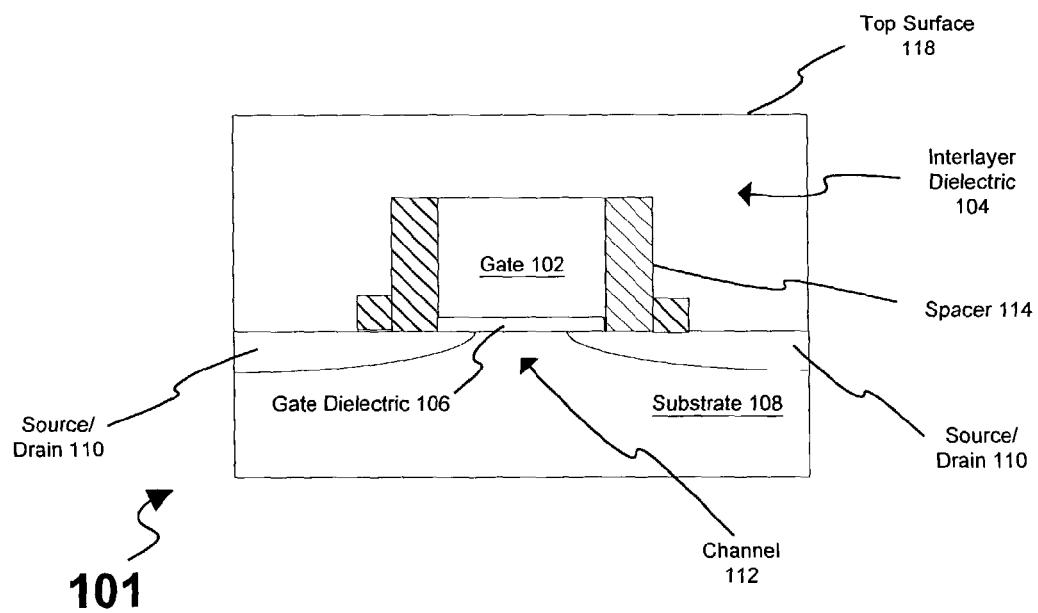
FIG. 1b is a post-annealing transistor incorporating one embodiment of the claimed subject matter.

FIG. 1b illustrates a transistor 101 that has been through at least one annealing process, resulting in the formation of source/drain regions 110. Specific components of transistor 101 may be structurally similar to those described in connection to transistor 100 above, and will not be further described in detail herein. Transistor 101 demonstrates a post-annealing transistor that has incorporated one embodiment of a sacrificial layer in accordance with the claimed subject matter. In the formation of transistor 101, one or more annealing processes such as those previously described may be used to activate the dopant implanted in area 116 of transistor 100. This may result in the formation of source/drain regions 110. After the incorporation of one or more annealing processes, sacrificial layer 120 may be substantially removed from top surface 118. Removal may be by any number of methods, but it is envisioned that for the above-described sacrificial layer comprised of phosphorous-doped polysilicon or a metal nitride (e.g. titanium nitride), removal may be accomplished prior to separation of the wafer into individual dice by a wet etch process, incorporating a hydroxide- or sulfuric acid/oxidant based chemistry that may etch said polysilicon or metal nitride films, respectively, selective to a permanent underlying interlayer dielectric material 104. However, it is important to note that removal is not limited to a wet etch process or to use of a hydroxide or a sulfuric acid/oxidant based chemistry, but any removal process that results in the removal of a substantial portion of the sacrificial layer is in accordance with the claimed subject matter.

Figure 3:
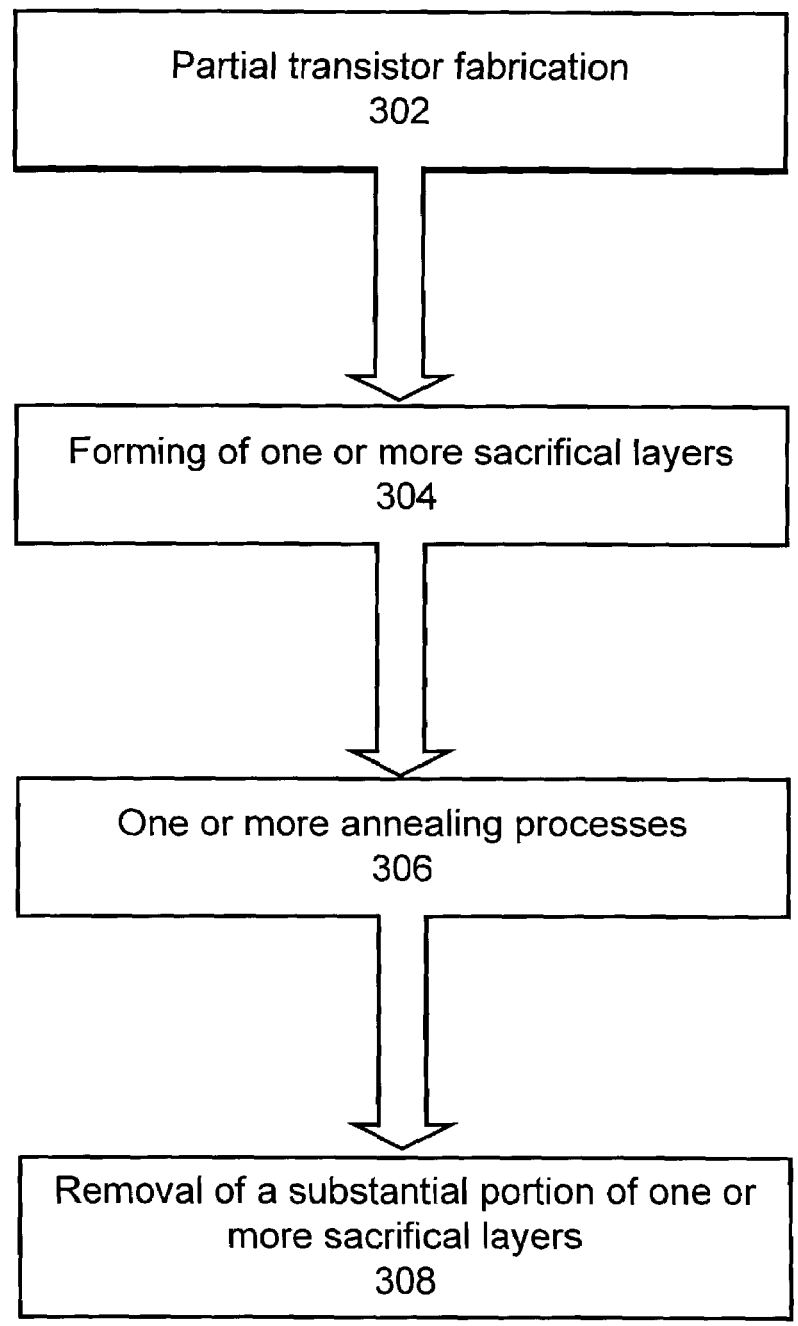
FIG. 3 represents the process utilized in the practice of one embodiment of the claimed subject matter.

FIG. 3 is a block flow diagram of a fabrication process incorporating one embodiment of a sacrificial annealing layer in accordance with the claimed subject matter. A semiconductor device such as a transistor IC device may be partially formed on a silicon wafer at block 302. A semiconductor device may include, for example, a transistor such as transistor 100 of FIG. 1A, and partial formation may comprise formation of a substrate such as substrate 108 of FIG. 1A, formation of a gate dielectric 106, formation of gate 102, formation of spacers 114, formation of an interlayer dielectric layer 104, and formation of one or more implanted dopant areas 116, for example. One or more sacrificial layers may be formed on the top surface of the semiconductor device at block 304. The semiconductor device may undergo one or more annealing processes at block 306. After the one or more annealing processes, a substantial portion of the one or more sacrificial layers may be removed at block 308.

In one embodiment, forming of one or more sacrificial layers may be performed by one or more well known forming processes, such as CVD or growing, as stated previously. In this embodiment, a single sacrificial layer may be formed on the silicon wafer, and may comprise a combination of materials such as a phosphorous-doped polysilicon or a metal nitride, for example. Alternatively, two or more layers may be formed on the wafer, and the two or more layers may be comprised of the same or differing materials, and may be formed using the same or differing processes. Additionally, the two or more sacrificial layers may layer differing areas of the top surface of the wafer, and may be based, for example, on the particular type of annealing process being used on a particular device on the wafer. For example, it is contemplated that one device being formed on a wafer may receive more annealing treatment than another, which may result in differing performance characteristics. This device may have a thicker or differing sacrificial layer formed thereon, based on the differing annealing treatment. As stated previously, selection of sacrificial layer materials may depend upon desired characteristics of the semiconductor device, or on the particular annealing processes being used to anneal the one or more devices formed on the wafer. Additionally, forming methods may depend on the one or more materials used as a sacrificial layer, for example.

In one embodiment, the semiconductor device, which was layered at block 304, may undergo one or more annealing processes. Such processes may include, for example, RTA or one or more types of laser annealing, or a combination of two or more annealing processes. The selection of annealing processes depends upon the desired characteristics of a semiconductor device, as well as the materials used to form the semiconductor device. Any method of annealing may be used in accordance with at least one embodiment of the claimed subject matter.

In one embodiment, removal of a substantial portion of the one or more sacrificial layers is performed at block 308. Removal may be performed by a number of processes, such as a wet etch of the entire silicon wafer, for example. The selection of removal processes may depend upon such factors as the types of material used as a sacrificial layer, or the type of material used to form one or more devices of the silicon wafer such as a transistor, for example. Any method of removal that results in the removal of a substantial portion of the one or more sacrificial layers of an semiconductor device formed on a silicon wafer is in accordance with the claimed subject matter.

It can be appreciated that the embodiments may be applied to the formation of any semiconductor device wherein annealing may be desirable. Certain features of the embodiments of the claimed subject matter have been illustrated as described herein, however, many modifications, substitutions, changes and equivalents will now occur to those skilled in the art. Additionally, while several functional blocks and relations between them have been described in detail, it is contemplated by those of skill in the art that several of the operations may be performed without the use of the others, or additional functions or relationships between functions may be established and still be in accordance with the claimed subject matter. It is, therefore, to be understood that the appended claims are intended to cover all such modifications and changes as fall within the true spirit of the embodiments of the claimed subject matter.

The invention claimed is:

1. A method of forming a semiconductor device, comprising:
    forming a sacrificial layer on at least a portion of a top surface of an interlayer dielectric of the semiconductor device to a thickness sufficient to prevent the interlayer dielectric from changing phases during a laser annealing process, wherein the sacrificial layer comprises a phosphorous doped polysilicon layer;
    annealing at least a portion of the semiconductor device;
    activating a dopant implanted in the semiconductor device; and
    removing a substantial portion of the sacrificial layer, wherein the removing results in no substantial physical alterations to the semiconductor device.

2. The method of claim 1, wherein said forming comprises a deposition process.

3. The method of claim 1, wherein the sacrificial layer comprises a metal nitride layer.

4. The method of claim 3, wherein said metal nitride comprises titanium nitride.

5. The method of claim 1, wherein the sacrificial layer is formed to layer a substantial portion of the top surface of the semiconductor device.

6. The method of claim 1, wherein said annealing comprises a laser annealing.

7. The method of claim 1, wherein said annealing comprises a rapid thermal annealing (RTA).

8. The method of claim 1, wherein said removing comprises selective removing, wherein the selective removing comprises an etch that removes a substantial portion of the sacrificial layer, selective to the top surface of the interlayer dielectric.

9. The method of claim 8, wherein selective removing comprises removing the sacrificial layer by using a chemical selected based on the chemical's ability to remove the sacrificial layer without substantial removal of other materials on the semiconductor device.

10. The method of claim 1, wherein said removing comprises a wet-etch.

11. The method of claim 10, wherein said wet etch comprises a hydroxide based wet etch.

12. The method of claim 10, wherein said wet etch comprises a sulfuric acid/oxidant based wet etch.

13. The method of claim 1, wherein the semiconductor device comprises a transistor embodied on a silicon wafer.

14. A method of annealing a silicon wafer, comprising:
at least partially forming a transistor on a silicon wafer;
forming a sacrificial layer on at least a portion of an interlayer dielectric of the silicon wafer to a thickness sufficient to prevent the interlayer dielectric from changing phases during a laser annealing process, wherein at least a portion of the sacrificial layer is comprised of phosphorous doped polysilicon;
annealing at least a portion of the silicon wafer;
activating a dopant implanted in the silicon wafer; and
removing a substantial portion of the sacrificial layer
wherein the removing results in no substantial physical alterations to the transistor.

15. The method of claim 14, further comprising removing a substantial portion of the sacrificial layer without substantial removal of other materials forming the silicon wafer.

16. The method of claim 14, wherein said forming the sacrificial layer comprises depositing a material by a chemical vapor deposition process.

17. The method of claim 14, wherein said forming the sacrificial layer comprises heating the silicon wafer while in the vicinity of a gaseous material.

18. The method of claim 14, wherein at least a portion of the sacrificial layer comprises a metal nitride layer.

19. The method of claim 18, wherein said metal nitride comprises titanium nitride.

20. The method of claim 14, wherein said annealing comprises a laser annealing process.

21. The method of claim 14, wherein said annealing comprises a rapid thermal annealing (RTA).

22. The method of claim 14, wherein said removing comprises a wet-etch.

23. The method of claim 22, wherein said wet etch comprises a hydroxide based wet etch.

24. The method of claim 22, wherein said wet etch comprises a sulfuric acid/oxidant based wet etch.

25. A method comprising:
forming a sacrificial layer on at least a portion of a top surface of an interlayer dielectric of a transistor to a thickness sufficient to prevent the interlayer dielectric from changing phases during a laser annealing process, wherein the sacrificial layer comprises a phosphorous doped polysilicon layer;
laser annealing at least a portion of the transistor;
absorbing, by the sacrificial layer, heat generated during the laser annealing;
activating a dopant implanted in a source region and a drain region of the transistor; and
removing a substantial portion of the sacrificial layer, wherein the laser annealing and removing do not substantially physically alter the transistor.

26. The method of claim 25, wherein the sacrificial layer comprises a metal nitride layer.

27. The method of claim 26, wherein the metal nitride comprises titanium nitride.

* * * * *